(12) United States Patent
Ananthan et al.

(10) Patent No.: US 8,933,429 B2
(45) Date of Patent: Jan. 13, 2015

(54) USING MULTI-LAYER MIMCAPS IN THE TUNNELING REGIME AS SELECTOR ELEMENT FOR A CROSS-BAR MEMORY ARRAY

(71) Applicant: Intermolecular Inc., San Jose, CA (US)

(72) Inventors: Venkat Ananthan, Cupertino, CA (US); Prashant B Phatak, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/974,278

(22) Filed: Aug. 23, 2013

(65) Prior Publication Data

US 2014/0264239 A1    Sep. 18, 2014

Related U.S. Application Data

(60) Provisional application No. 61/785,069, filed on Mar. 14, 2013.

(51) Int. Cl.
*H01L 47/00* (2006.01)
*H01L 45/00* (2006.01)
*G11C 13/00* (2006.01)
*H01L 21/66* (2006.01)

(52) U.S. Cl.
CPC ............ *H01L 45/14* (2013.01); *H01L 45/1608* (2013.01); *H01L 45/12* (2013.01); *H01L 45/16* (2013.01); *H01L 45/1253* (2013.01); *H01L 45/144* (2013.01); *H01L 45/1616* (2013.01); *G11C 13/0069* (2013.01); *H01L 22/12* (2013.01); *G11C 13/0002* (2013.01); *G11C 13/0007* (2013.01); *G11C 2013/0083* (2013.01); *G11C 2213/15* (2013.01); *G11C 2213/71* (2013.01); *G11C 2213/77* (2013.01)
USPC ........ 257/4; 257/532; 257/343; 257/E27.034; 438/104; 438/260; 438/382; 438/396

(58) Field of Classification Search
USPC ...................... 257/4, 532, E29.343, E27.034; 438/104, 260, 382, 396
See application file for complete search history.

(56) References Cited

U.S. PATENT DOCUMENTS 7,378,719 B2   5/2008   Yang
2006/0255392 A1   11/2006   Cho et al.

OTHER PUBLICATIONS

Varistor-type Bidirectional Switch (JMAX>107 A/cm2,Selectivity~104) for 3D Bipolar Resistive Memory Arrays; Wootae Lee, et al. IEEE 2012.

*Primary Examiner* — Mark A Laurenzi

(57) ABSTRACT

Selector devices that can be suitable for memory device applications can have low leakage currents at low voltages to reduce sneak current paths for non selected devices, and high leakage currents at high voltages to minimize voltage drops during device switching. The selector device can include a first electrode, a tri-layer dielectric layer, and a second electrode. The tri-layer dielectric layer can include a low band gap dielectric layer disposed between two higher band gap dielectric layers. The high band gap dielectric layers can be doped with doping materials to form traps at energy levels higher than the operating voltage of the memory device.

15 Claims, 10 Drawing Sheets

```
┌─────────────────────────────────────────┐
│   Forming a first electrode on a substrate │
│                   1000                   │
└─────────────────────────────────────────┘
                     ↓
┌─────────────────────────────────────────┐
│ Forming a first dielectric or semiconductor layer on │
│  the first electrode, wherein the first layer comprises │
│             a large band gap             │
│                   1010                   │
└─────────────────────────────────────────┘
                     ↓
┌─────────────────────────────────────────┐
│  Treating the first layer to generate defects, wherein │
│    the energy levels of the defects is between the │
│    conduction band minimum of the first layer and a │
│  defect energy level, wherein the defect energy level │
│   is 0.3 – 0.7 eV higher than the Fermi level of the first │
│                 electrode                │
│                   1020                   │
└─────────────────────────────────────────┘
                     ↓
┌─────────────────────────────────────────┐
│ Forming a second dielectric or semiconductor layer │
│     on the first layer, wherein the second layer │
│          comprises a small band gap      │
│                   1030                   │
└─────────────────────────────────────────┘
                     ↓
┌─────────────────────────────────────────┐
│ Forming a third dielectric or semiconductor layer on │
│  the second layer, wherein the third layer comprises │
│             a large band gap             │
│                   1040                   │
└─────────────────────────────────────────┘
                     ↓
┌─────────────────────────────────────────┐
│  Treating the third layer to generate defects, wherein │
│    the energy levels of the defects is between the │
│    conduction band minimum of the third layer and a │
│  defect energy level, wherein the defect energy level │
│     is 0.3 – 0.7 eV higher than the Fermi level of a │
│              second electrode            │
│                   1050                   │
└─────────────────────────────────────────┘
                     ↓
┌─────────────────────────────────────────┐
│   Forming the second electrode on the third layer │
│                   1060                   │
└─────────────────────────────────────────┘
```

*FIG. 10*

USING MULTI-LAYER MIMCAPS IN THE TUNNELING REGIME AS SELECTOR ELEMENT FOR A CROSS-BAR MEMORY ARRAY

This application claims priority to U.S. Provisional Patent Application No. 61/785,069 entitled "ReRAM Materials" filed on Mar. 14, 2013, which is incorporated herein by reference.

FIELD OF THE INVENTION

This invention relates generally to non-volatile memory arrays, and more particularly, to methods for forming current selectors used in nonvolatile memory devices.

BACKGROUND

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments. Nonvolatile memory is often formed using electrically-erasable programmable read only memory (EPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive memory devices, such as resistive random access memory (ReRAM), phase change memory (PCM), or magnetoresistive random access memory (MRAM).

Resistive memory devices can be formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Non-destructive read operations can be performed to ascertain the value of a data bit that is stored in a memory cell.

In non volatile memory structures, selector devices can screen the memory elements from sneak current paths to ensure that only the selected bits are read or programmed. Schottky diode can be used as a selector device, which can include p-n junction diode or metal-semiconductor diode, which requires high thermal budget that may not be acceptable for 3D memory application. Metal-Insulator-Metal Capacitor (MIMCAP) tunneling diodes may have a challenge of getting controllable low barrier height and low series resistance.

Therefore, there is a need for selector devices for advanced memory devices.

SUMMARY

In some embodiments, a unipolar or bipolar selector device is disclosed that can be suitable for memory device applications. The selector device can have low leakage currents at low voltages to reduce sneak current paths for non-selected devices, and high leakage currents at high voltages to minimize voltage drops during device switching.

In some embodiments, the selector device can include a first electrode, a tri-layer non-conducting layer, and a second electrode. The tri-layer non-conducting layer can include a low band gap dielectric or semiconductor layer disposed between two higher band gap dielectric or semiconductor layers. The high band gap layers can be doped with a doping material to create defect levels or traps from the conduction band minimum down to an energy level that is offset from the Fermi level of the electrode by an amount less than the operating voltage of the memory devices.

In some embodiments, the electrode can include conductive materials having high work function, for example, to minimize the leakage current to the non-conducting layer at low voltages. The electrode materials can have work function greater than about 3 eV, or greater than 4 eV, such as 4.5 or 5 eV. The electrode materials can include TiN, TaN, Pt, Ru, or any mixture or alloy combination thereof.

In some embodiments, the high band gap non-conducting layer can include defects or traps, which can allow electrons, which have tunneled through the high band gap layer, to pass through the low band gap layer. In some embodiments, the high band gap layer can be optimized to not significantly affect the current flow at high voltages, and to significantly limit the current flow at low voltages. For example, the high band gap layer can include dielectric or semiconductor materials having a leakage current density lower than $10^3$ A/cm$^2$ at a low voltage of 1 V, and having a leakage current density greater than $10^6$ or $10^7$ A/cm$^2$ at a high voltage of 2 V.

In some embodiments, the thickness of the high band gap non-conducting layer can be less than 20 nm, such as between 5 and 20 nm. In some embodiments, the high band gap dielectric layer can include $ZrO_x$, $HfO_x$, $AlO_x$, or any mixture or alloy combination thereof.

In some embodiments, the low band gap dielectric layer can be optimized to allow high leakage current at high voltages. The low band gap layer can include a material or a composition different from that of the high band gap dielectric layer. For example, the low band gap layer can include dielectric materials having a leakage current density greater than $10^6$ or $10^7$ A/cm$^2$ at a high voltage of 2 V.

In some embodiments, the thickness of the low band gap dielectric layer can be less than 20 nm, such as between 5 and 20 nm. In some embodiments, the low band gap dielectric layer can include $TiO_x$, $TaO_x$, or any mixture or alloy combination thereof.

In some embodiments, methods to form selector devices, including performing treatments after depositing the electrode layers, the high band gap dielectric layers, and/or the low band gap dielectric layer are disclosed. The treatment can include rapid thermal annealing or plasma treatment, such as a rapid thermal anneal in temperatures between 200 and 400 C, plasma hydrogen anneal, and/or in-situ annealing after deposition. The treatments can modify the deposited layers to achieve the desired selector characteristics.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 10 illustrates a flowchart for forming a current selector according to some embodiments.

DETAILED DESCRIPTION

Figure 1:
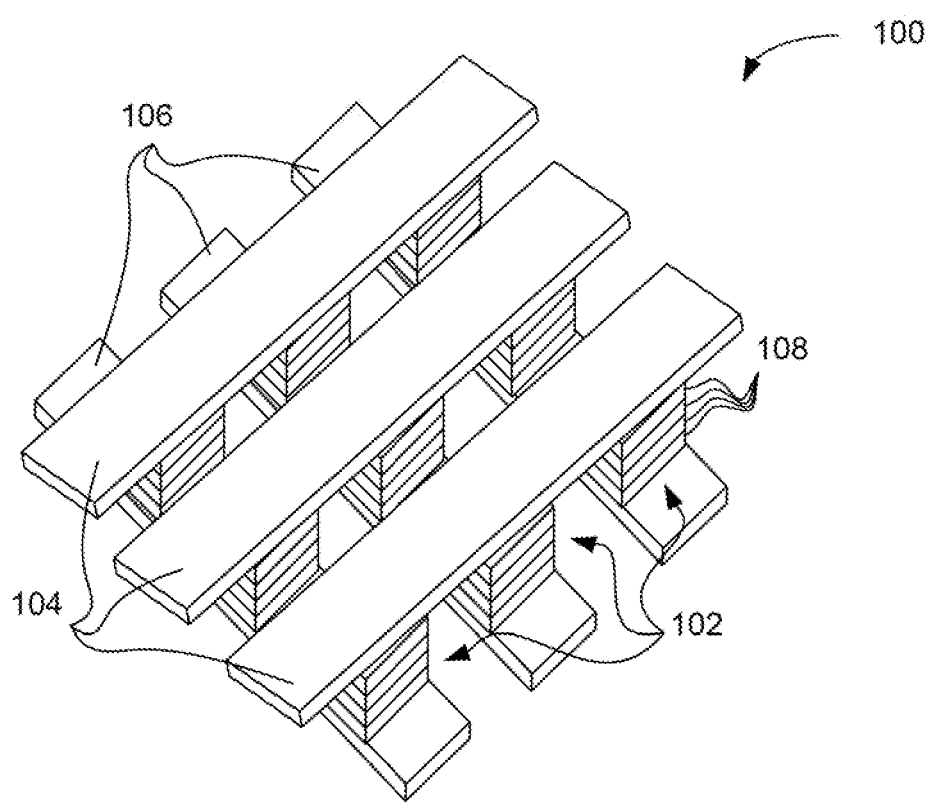
FIG. 1 illustrates a memory array of resistive switching memory elements according to some embodiments.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

A cross-bar architecture is promising for future non-volatile memories such as phase change memory (PCM) or resistive random access memory (ReRAM) because of the small cell size of $4F^2$ achievable with each cell at the intersections of perpendicular word lines and bit lines, and the potential to stack multiple layers to achieve very high memory density. Two key challenges for the cross bar architecture are the possibility of current sneak-through paths (e.g., when trying to read a cell in high resistance state adjacent to cells in low resistance state) and the need to avoid unselected cell modification when half of the switching voltage is applied to the selected cell In some embodiments, current selectors or current steering devices are provided with a non-linear current-voltage (I-V) behavior, including low current at low voltages and high current at higher voltages. Unipolar selector can be appropriate for a unipolar memory such as PCM whereas bipolar selector can be more appropriate for a bipolar memory such as ReRAM and spin transfer torque random access memory (STT-RAM). The unipolar selector can have high resistance in reverse polarity. The bipolar selector can have high resistance at low voltages. These selectors can prevent sneak-through current even when adjacent memory elements are in low-resistance state. Furthermore, the non-linear I-V can also provide the current selector with low resistance at higher voltages so that there is no significant voltage drop across the current selector during switching.

In some embodiments, current selectors requiring low temperature processing (e.g., <650 C) are provided, which can be suitable for emerging non-volatile memory architectures such as PCM and STT-RAM. In addition, the current selectors can include fab-friendly materials and can still exhibit a desired device performance.

In some embodiments, electrode-trilayer non-conducting-electrode stacks are provided as unipolar or bipolar current selectors with low leakage at low voltages and high leakage at high voltages. The trilayer non-conducting layer can include two wide, e.g., high, band gap semiconductor or dielectric layers with defect traps at appropriate energy levels. The energy trap levels are configured such that at low voltages, the carriers from the electrodes cannot access the traps, and thus cannot tunnel through the trilayer non-conducting stack. This can provide low leakage currents at low voltages. The energy trap levels are also configured such that at high voltages when the device is on, the energy band of the high band gap semiconductor or dielectric layers will be bent enough such that the energy levels of the defect traps are now below the electrode Fermi levels. This can allow the carriers to tunnel into the trap levels, and provide high forward leakage current at high voltages.

In some embodiments, defects and/or traps can be introduced into the semiconductor or dielectric layers by making the film non-stoichiometric, or by annealing in a reducing ambient e.g., forming gas or $N_2$. These defects can also be generated by providing a doping material such as oxygen, carbon, boron, or silicon dopants into the semiconductor or dielectric layers, resulting in, for example, vacancies or interstitials of oxygen, carbon, boron or silicon, which can have energy levels in the band gap below the conduction band minimum. In some embodiments, the energy levels can be engineered to maintain a proper distance with the conduction band edge, preventing energy levels that are too close or too far from the conduction band edge. In some embodiments, high defect density can be provided to the semiconductor or dielectric layers, e.g., to provide high currents at high voltages until the electron conduction through the semiconductor or dielectric eventually becomes space charge limited conduction.

Since the conduction through the high band gap layers at high voltages is defect tunneling, the thickness of the high band gap layers can be less than 20 nm, such as between 5 and 20 nm, which does not affect the trap tunneling mechanism. The high band gap layer can include $ZrO_x$, $HfO_x$ and $AlO_x$. The high band gap can have electron affinity between 1 and 2 eV, and/or can have band gap energy between 4 and 10 eV.

In some embodiments, a low band gap non-conducting layer such as $TiO_x$ or $TaO_x$ can be placed in the middle of the two high band gap layers. The low band gap layer can allow high current densities at higher voltages due to its lower band gap and/or higher electron affinity. Other layers with low band gap such as strontium titanate (STO), or ZnO can also be used. The thickness of the low band gap layer can be less than 20 nm, such as between 5 and 20 nm. The low band gap dielectric can have electron affinity between 3.5 and 4.5 eV, and/or can have band gap energy between 1 and 3.5 eV.

In some embodiments, symmetrical and asymmetrical current selectors can be provided as bipolar and unipolar current steering elements, respectively. For example, in asymmetrical current selectors, one electrode interface can have a high barrier height (e.g., TiN—ZrO$_2$ or Pt—TiO$_2$) and the other electrode interface can be ohmic.

The memory cells can be configured in a cross point memory array. The cross point memory arrays can include horizontal word lines that cross vertical bit lines. Memory cells can be located at the cross points of the word lines and the bit lines. The memory cells can function as the storage elements of a memory array.

FIG. 1 illustrates a memory array of resistive switching memory elements according to some embodiments. A memory array can include multiple memory devices placed at the cross points of upper and lower conduction lines. Memory array 100 may be part of a memory device or other integrated circuit. Memory array 100 is an example of potential memory configurations; it is understood that several other configurations are possible.

Read and write circuitry may be connected to memory elements 102 using signal lines 104 and orthogonal signal lines 106. Signal lines such as signal lines 104 and signal lines 106 are sometimes referred to as word lines and bit lines and are used to read and write data into the elements 102 of array 100. Individual memory elements 102 or groups of memory elements 102 can be addressed using appropriate sets of signal lines 104 and 106. Memory element 102 may be formed from one or more layers 108 of materials, as is described in further detail below. In addition, the memory arrays shown can be stacked in a vertical fashion to make multi-layer 3-D memory arrays.

Any suitable read and write circuitry and array layout scheme may be used to construct a non-volatile memory device from resistive switching memory elements such as element 102. For example, horizontal and vertical lines 104 and 106 may be connected directly to the terminals of resistive switching memory elements 102. This is merely illustrative.

During the operation of the cross point memory array, such as a read operation, the state of a memory element 102 can be sensed by applying a sensing voltage (i.e., a "read" voltage) to an appropriate set of signal lines 104 and 106. Depending on its history, a memory element that is addressed in this way may be in either a high resistance state or a low resistance state. The resistance of the memory element therefore determines what digital data is being stored by the memory element. If the memory element has a low resistance, for example, the memory element may be said to contain a logic one (i.e., a "1" bit). If, on the other hand, the memory element has a high resistance, the memory element may be said to contain a logic zero (i.e., a "0" bit). During a write operation, the state of a memory element can be changed by application of suitable write signals to an appropriate set of signal lines 104 and 106.

Ideally, only the selected memory cell, e.g., during a read operation, can experience a current. However, currents, often referred as sneak path currents, can flow through unselected memory elements during the read operation. The sensing the resistance state of a single memory call can be unreliable. For example, all memory cells in the array are coupled together through many parallel paths. The resistance measured at one cross point can include the resistance of the memory cell at that cross point in parallel with resistances of the memory cells in the other rows and columns.

Figure 2:
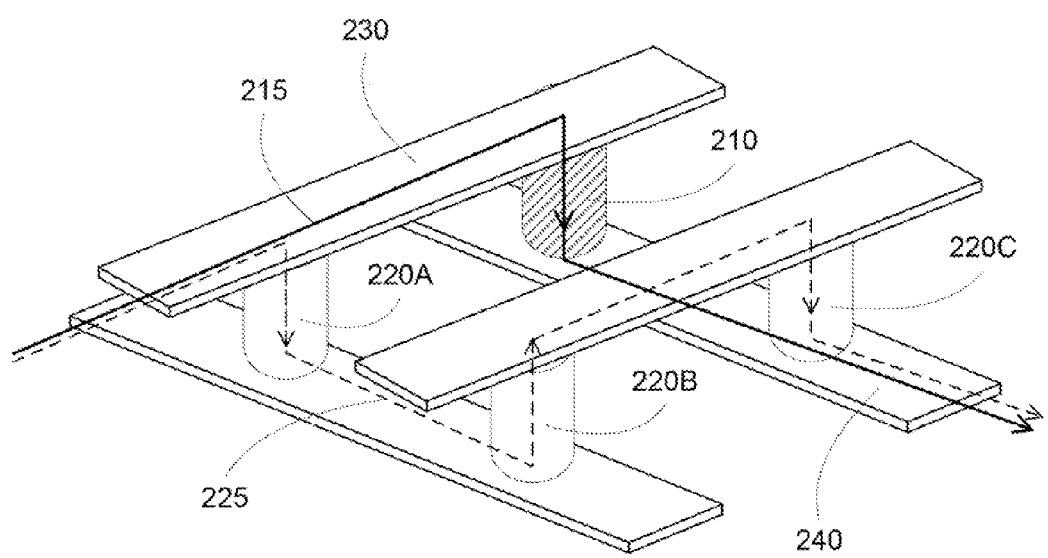
FIG. 2 illustrates sneak path currents in a cross point memory array according to some embodiments.

FIG. 2 illustrates sneak path currents in a cross point memory array according to some embodiments. Sneak path currents can exist concurrently with operating current when a voltage is applied to the cross point memory array. A memory cell 210 can be selected, for example, for a read operation, by applying a voltage to signal line 230, and grounding signal line 240. A sensing current 215 can flow through the memory cell 210. However, parallel current paths, e.g., sneak path current, can exist, for example, represented by a series of memory cells 220A, 220B, and 220C. The applied voltage (signal line 230) can generate a current 225 through memory cells 220A-220C, and returning to the ground (signal line 240). The sneak path current 225 can be particularly large, e.g., larger than the sensing current 215, when the selected cell 210 is at high resistance state and the neighbor cells 220A-220C are at low resistance state.

There can be multiple sneak path currents 225, and the resistances of the series memory cells 220A-220C can be smaller than that of the selected memory cell 210, thus can obscure the sense current 215 through the selected memory cell 210 during a read operation.

To reduce or eliminate the sneak path occurrence, a control device, e.g., a selector, can be used in the cross point memory array. For example, a diode can be located in each memory cell. The control device can isolate the selected memory cell from unselected memory cells by breaking parallel connections of the memory cells.

The sneak path current 225 can include currents in opposite direction as compared to the sensing current. For example, as seen in FIG. 2, sneak path current 225 passes through memory device 220B at an opposite direction, e.g., upward, as compared to the sensing current 215 passing through the selected memory cell 210. Thus a one-way electrical device, such as a diode, can be used to block the sneak current path 225. For example, a diode can be added to each memory device, e.g., memory devices 210, and 220A-220C, thus allowing currents to pass only in one direction. As an example, the diodes can be incorporated to the memory devices so that the current can only pass in a downward direction in FIG. 2. With the incorporation of diodes, the sneak path current can be blocked, for example, at memory device 220B.

In some embodiments, methods and systems for lower current values through a memory element, for example, during a read operation or a set or reset operation, are provided. The current for the memory element can be significantly reduced at lower than the operating voltages, such as a read voltage, while still maintaining appropriate current at the operating voltages to avoid interfering with the memory device operations. In some embodiments, the current density can be small, e.g., <10$^3$ A/cm$^2$, at half of the operating voltage ($V_s/2$) to prevent modification to the memory array. The low current at half the operating voltage can ensure that when $V_s/2$ is applied to selected cell, e.g., $V_s/2$ is applied to selected row and $-V_s/2$ is applied to selected column, the other cells on the selected row and column are not accidentally programmed or disturbed. The current selector thus should have high resistance at $V_s/2$. In some embodiments, the current density can be large, e.g., ~10$^6$-10$^7$ A/cm$^2$, at the operating voltage, e.g., set or reset voltage to allow switching of the memory cells. In other words, the current selector can have very low resistance at $V_s$ to ensure that the voltage drop across the current selector can be minimal during the memory cell programming.

In some embodiments, methods and systems for a non-linear current response of a memory element are provided. At low voltages, e.g., lower than the operating voltages or at half an operating voltage, the current can be significantly reduced, while the current can remain the same or can be controlled to ensure proper operation of the memory devices. The lower current values at low voltages can also reduce power consumption and thus improve the power efficiency of the memory arrays.

In some embodiments, selector devices, and methods to fabricate selector devices, for resistive-switching memory elements and cross point memory array are provided. The selector device can be constructed using familiar and available materials currently used in fabrication facilities. The fabrication process of the selector device may require low thermal budget, suitable for back end or 3D memory applications. In addition, the process can be simple, providing a robust process for manufacturing.

Figure 3A:
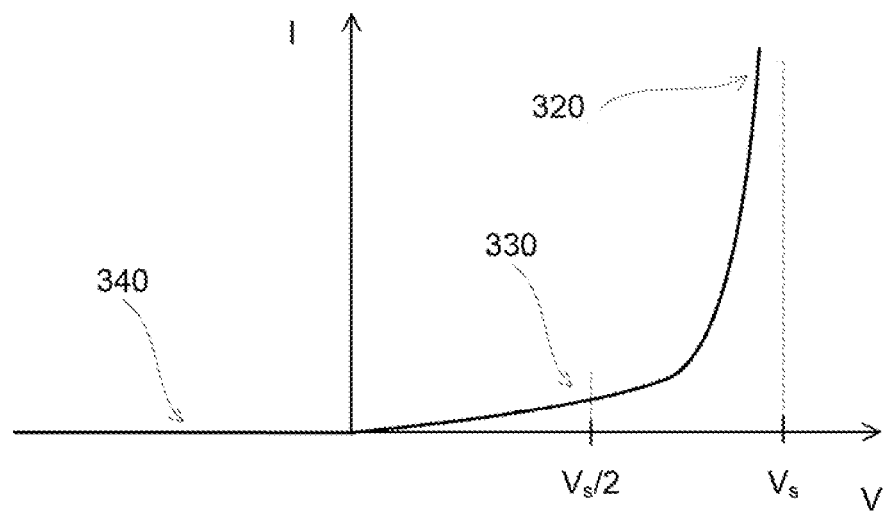
FIGS. 3A-3B illustrate examples of I-V response for a selector device according to some embodiments.
Figure 3B:
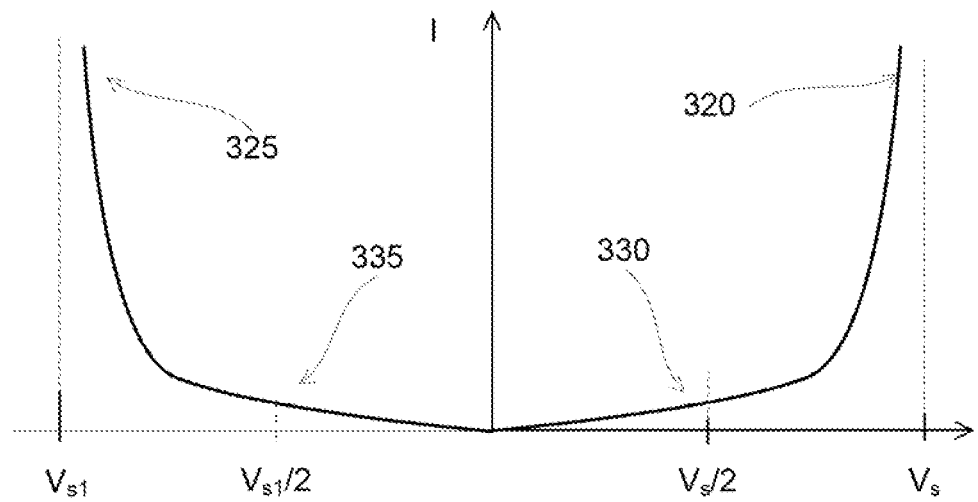

FIGS. 3A-3B illustrate examples of I-V response for a selector device according to some embodiments. The I-V response can be non linear, including low leakage currents at low voltages and high leakage currents at high voltages. In FIG. 3A, a current voltage response, e.g., I-V curve, for a selector device is shown. The current can start from low current (e.g., zero current) at zero voltage, and can increase until the operating voltage $V_s$, such as the reset voltage $V_{reset}$. The current can slowly increase for low voltages, e.g., less than $V_s/2$, and then rapidly increase toward the operating voltage $V_s$. The low current at the vicinity of zero voltage can reduce the leakage current. For example, the current density 330 at half the operating voltage can be less than about $10^3$ $A/cm^2$ to prevent accidental changes to the memory cells. At high voltages, such as at the operating voltage $V_s$, the current can be very high to prevent any interference with the operation of the memory devices. For example, the current density 320 at the operating voltage can be higher than about $10^6$ or $10^7$ $A/cm^2$ so that the voltage drop across the selector device is small. At opposite voltage, the current density 340 can be small, e.g., negligible, to be used as a diode for unipolar memory cells.

FIG. 3B shows a current response for a selector device that can be used for bipolar memory cells. The current response curve can be similar in both positive and negative polarities. For example, in the positive voltages, the current can be small 330 at $V_s/2$, and very large 320 at $V_s$. For negative voltages, the current behavior can be similar, e.g., small 335 at half an operating voltage $V_{s1}/2$, and large 325 at the operating voltage $V_{s1}$. As shown, both curves are plotted on the upper half of an I-V coordinate, but in general, the left half can be plotted on an (–I)-(V) axis while the right half can be plotted on I-V axis. This approach can account for a linear-log plot, for example, with the voltage axis being linear and the current axis being logarithm.

In some embodiments, the curves can be symmetrical, e.g., $V_s = V_{s1}$. For example, in bipolar memory cell, the set voltage $V_{set}$ and reset voltage $V_{reset}$ can have a same magnitude with opposite polarities. In some embodiments, the curves can be asymmetrical, e.g., $V_s \neq V_{s1}$.

Figure 4A:
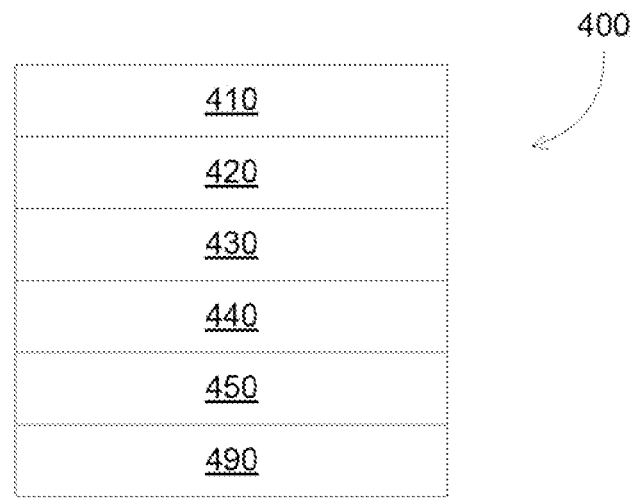
FIGS. 4A-4B illustrate an example of a current selector together with a memory stack incorporating the current selector according to some embodiments.
Figure 4B:
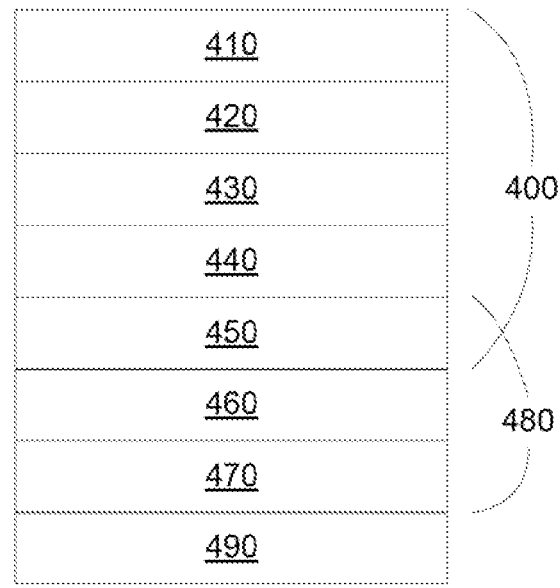

FIGS. 4A-4B illustrate an example of a current selector together with a memory stack incorporating the current selector according to some embodiments. A current selector can include multilayer dielectric or semiconductor disposed between two electrodes. The current selector can be placed adjacent to a memory device to form a memory stack.

In FIG. 4A, a current selector 400 can be disposed on a substrate 490, and can include a first high band gap layer 420, a low band gap layer 430, and a second high band gap layer 440, sandwiched between two electrodes 410 and 450. The first and second high band gap layers can be doped with a doping material to create defects at appropriate energy levels, for example, to allow high current at high voltages (such as at the operating voltage of the memory devices), and to limit low current at low voltages (such as at half of the operating voltage). The first and second high band gap layers can be the same or can be different, e.g., different thicknesses or different materials. The two electrodes can be the same or can be different, e.g., different materials.

In FIG. 4B, a current selector 400 can be placed in series with a memory element 480, which is disposed on a substrate 490. The memory element can include a switching layer 460 sandwiched between two electrodes 450 and 470. As shown, the current selector 400 and the memory element 480 share a common electrode 450.

In some embodiments, the high band gap layers of the current selector 400 can include a dielectric layer or a semiconductor layer, and can function to restrict the current flow across the current selector in the low voltage region, and to allow current flow in the high voltage region. The high band gap layers can be doped to form defect traps, which can lower the energy levels of the high band gap layers to be below the conduction band minimum levels. The defects can be configured so that the defect energy levels are separated from the Fermi level by an amount equal or less than to the operating voltage.

In some embodiments, the high band gap defected layer can be formed by introducing defects or traps in a high band gap layer, for example, in a $HfO_2$ layer at energy levels such that carriers can tunnel through the defects in the high band gap layer. The choice of film deposition conditions or dopant can be chosen so that defects with desired energy levels can be obtained. For high defect density in the dielectric film, high currents can be achieved at high voltages until the electron conduction through the dielectric eventually becomes space charge limited conduction.

The high band gap defected layer can be operated on a defect tunneling principle. At low applied voltages, the band bending is small, and the defect energy levels can still be well above the Fermi level, thus the probability of defect tunneling through the high band gap layer is low, resulting in a low current. At high applied voltages, the band bending is higher, bending the defect energy levels to be below the Fermi level, leading to the defect tunneling through the high band gap layer, resulting in a high current through the selector device.

In addition, the band gap and the electron affinity of the high band gap layer can be optimized to achieve no tunneling current (or very low tunneling current) at low applied voltages, and significant tunneling current at high applied voltages. For example, dielectric materials having low electron affinity of less than about 3 eV (or less than 3.5 eV in some embodiments), such as 2.7 eV for $ZrO_x$, can be used. Dielectric materials having large band gap of greater than 4 eV (or greater than 4.5 eV in some embodiments), such as 5 eV for $ZrO_x$ or $HfO_x$, or 8 eV for $AlO_x$, can be used. The thickness of the high band gap layer can be less than 20 nm, such as between 5 and 20 nm. The high band gap layer can include $ZrO_x$ (for example, $ZrO_2$ doped with a doping material to form defects), $HfO_x$ (for example, $HfO_2$ doped with a doping material to form defects), or $AlO_x$ (for example, $Al_2O_3$ doped with a doping material to form defects). In some embodiments, the high band gap layer can have a leakage current density less than $10^3$ $A/cm^2$ at half an operating voltage, e.g., about between 1 and 2 V, and can have a leakage current density of higher than about $10^6$ $A/cm^2$, such as higher than $10^7$ $A/cm^2$ at an operating voltage, e.g., about between 2 and 5 V.

In some embodiments, the low band gap layers of the current selector 400 can include a dielectric or semiconductor layer, and can function to enhance the current flow across the current selector, after passing, e.g., defect tunneling, through the high band gap layer. The leakage of the low band gap layer can be optimized to allow high current flow during the high applied voltages while minimizing the current flow during low applied voltages. In addition, the band gap and the electron affinity of the low band gap layer can be optimized to achieve high current flow during the high applied voltages while minimizing the current flow during low applied voltages. For example, dielectric materials having high electron affinity of greater than about 3 eV (or less than 3.5 eV in some embodiments), such as 4.1 eV for $TiO_2$, can be used. In some embodiments, the low band gap layer can have electron affinity larger than that of the high band gap layers. Dielectric materials having low band gap of less than 3.5 eV (or less than 4 eV in some embodiments), such as 3 eV for $TiO_2$, 3.2 eV for STO or ZnO can be used. In some embodiments, the low band gap layer can have band gap smaller than that of the high band gap layer. The thickness of the low band gap layer can be less than 20 nm, such as between 5 and 20 nm. The low band gap layer can include $TiO_x$, including $TiO_2$, and $TaO_x$, including $TaO_2$. In some embodiments, the low band gap layer can have a leakage current density higher than $10^6$ $A/cm^2$, or $10^7$ $A/cm^2$ at 2 V. In some embodiments, the low band gap layer can have a leakage current higher than that of the high band gap layer.

Figure 5A:
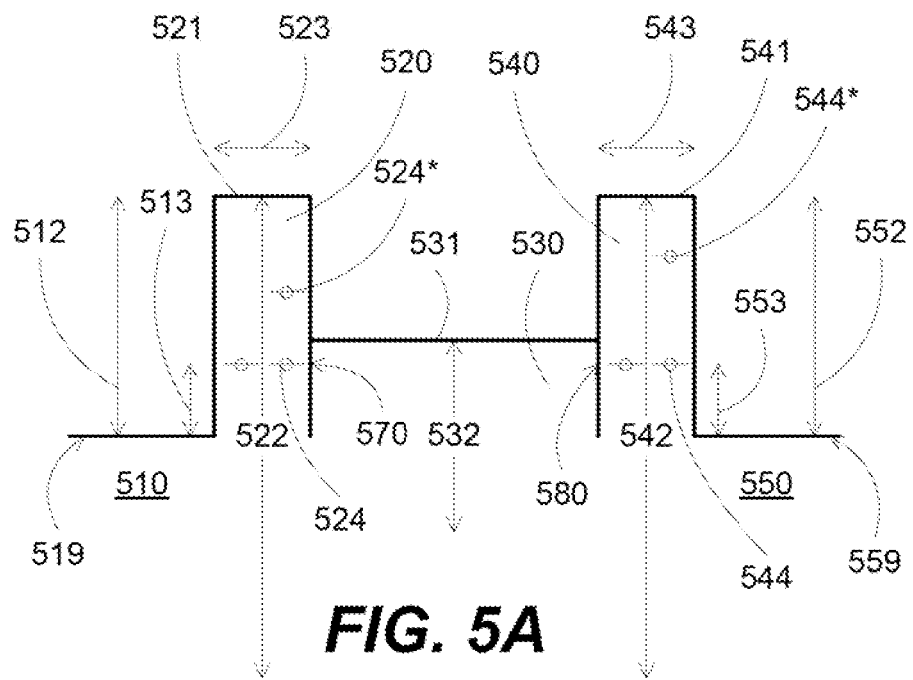
FIGS. 5A-5B illustrate examples of band diagrams for selector devices according to some embodiments.
Figure 5B:
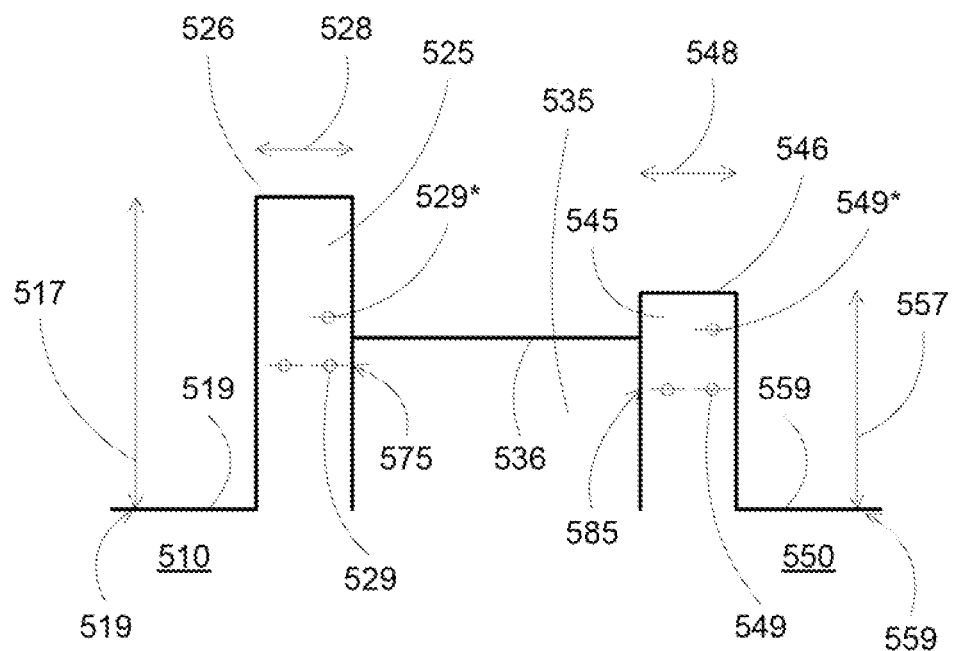

FIGS. 5A-5B illustrate examples of band diagrams for selector devices according to some embodiments. In FIG. 5A, a low band gap layer 530 is disposed between two high band gap layers 520 and 540. The layers 520, 530, and 540 can be disposed between two electrodes 510 and 550. At equilibrium, e.g., at zero applied voltage, there is no current, or only minimum leakage current due to the energy barrier 513 or 553 between the electrodes and the high band gap layers 520 or 540. In some embodiments, the high band gap layer 520 or 540 can be characterized as having a leakage current density of less than $10^3$ $A/cm^2$ at half the operating voltage. The high band gap layer 520 or 540 can have a large band gap 522 or 542 and a small thickness 523 or 543, respectively. In some embodiments, the low band gap layer 530 can be characterized as having a leakage current density of greater than $10^6$ or $10^7$ $A/cm^2$ at the operating voltage. The low band gap layer 530 can have defects or traps 535 to increase it leakage characteristics. The low band gap layer 530 can have a low band gap 532 and a larger thickness than those of the high band gap layers 520 and 540.

In some embodiments, the band gap and electron affinity of the high band gap layer 520 or 540 can be chosen to have a high energy barrier 512 or 552 with the Fermi level 519 or 559 of the electrodes. For example, the electrode material and the high band gap material can be chosen to form a barrier height of greater than 1 eV, or greater than 2 eV. The high band gap layers 520 and 540 can be doped with a doping material to form defects or traps 524/524* and 544/544*. The energy levels of the defects 524/524* and 544/544* can be configured to be near the conduction band minimum 521 and 541. In some embodiments, the defect energy levels are from minimum trap energy levels 570 and 580 to the conduction band minimum 521 and 541. The minimum trap energy levels 570 and 580 can be higher than the Fermi level 519 and 559 of the electrodes by a maximum energy amount 513 and 553 which are less than operating voltage $V_s$ of the memory device. In other words, defects are configured so that the operating voltage $V_s$ is higher than the minimum trap energy levels 570 and 580. In some embodiments, the defect energy levels can be only at the minimum trap energy levels 570 and 580. In some embodiments, the defect energy levels can be distributed from the conduction band minimum 521 and 541 to the minimum trap energy levels 570 and 580.

In some embodiments, the maximum energy amount 513 and 543 can be between 0.3 and 0.7 eV. In other words, the minimum trap energy levels 570 and 580 can be between 0.3 and 0.7 eV from the Fermi level 519 and 559 of the electrodes.

The thickness 523 or 543 of the high band gap layer 520 or 540 can be chosen, in conjunction with the electron affinity and band gap values, to allow defect tunneling at high voltage region, e.g., greater than half the operating voltage. The selector device can have a symmetrical energy band diagram, allowing similar behavior for both polarities of applied voltages. The selector device with symmetrical behavior can be suitable for bipolar memory cells and arrays. Due to the defects tunneling process, the thickness of the high band gap layers 520 and 540 can be higher than the normal thickness of a tunneling-able dielectric layer. For example, the thickness of the layers 520 and 540 can be less than 20 nm, such as between 5 and 20 nm.

In some embodiments, the low band gap layer 530 can be characterized as having a leakage current density of greater than $10^6$ or $10^7$ $A/cm^2$ at the operating voltage. The low band gap layer 530 can have optional defects or traps (not shown) to increase its leakage characteristics. The low band gap layer 530 can have a low band gap 532 and a thicker thickness.

In some embodiments, the band gap and electron affinity of the low band gap layer 530 can be chosen to have a low energy barrier with the Fermi level 519 and 559 of the electrodes. For example, the conduction band minimum 531 of the low band gap layer 530 can be lower than those of the high band gap layers 520 and 540. In some embodiments, the conduction band minimum 531 of the low band gap layer 530 can be configured to be at about or higher than the minimum trap energy levels 570 and 580 of the high band gap layers 520 and 540. The conduction band minimum 531 can be offset an amount of about less than 0.5 eV or 0.2 eV from the minimum trap energy levels 570 and 580, e.g., the conduction band minimum 531 can be higher to about between 0.5 to 0.9 eV as compared to the Fermi level 519 and 559 of the electrodes 510 and 550.

The thickness of the low band gap layer 530 can be chosen, in conjunction with the electron affinity and band gap values, to allow high leakage current at high voltage region, e.g., greater than half the operating voltage. For example, the thickness of the layer 530 can be less than 20 nm, such as between 5 and 20 nm.

The symmetrical selector device can have low leakage current at low voltages, and high current at high voltages. For example, at half an operating voltage in either polarity, the leakage current through the selector device can be small. At the operating voltage, the current through the selector device can be large.

In FIG. 5B, an asymmetrical selector device is shown. The energy barrier 517 for the left high band gap layer 525 can be higher (or lower, not shown) than the energy barrier 557 for the right high band gap layer 545. As shown, the conduction band minimum 526 is higher than the conduction band minimum 546. The high band gap layers 525 and 545 can be doped to form defects 529/529* and 549/549*, which can have minimum defect energy levels 575 and 585. The minimum defect energy levels 575 and 585 can be about 0.3 to 0.7 eV higher than the Fermi levels 519 and 559 of the electrode 510 and 550. The conduction band minimum 536 of the low band gap layer 535 can be about 0.2 eV to 0.3 eV offset, e.g., higher or lower, from the minimum defect energy levels 575 and 585. Thus the conduction band minimum 536 can be about 0.5 eV to 0.9 eV higher than the Fermi level 519 or 559. The thicknesses 528 and 548 of the two high band gap layers 525 and 545 can be the same or different.

Figure 6A:
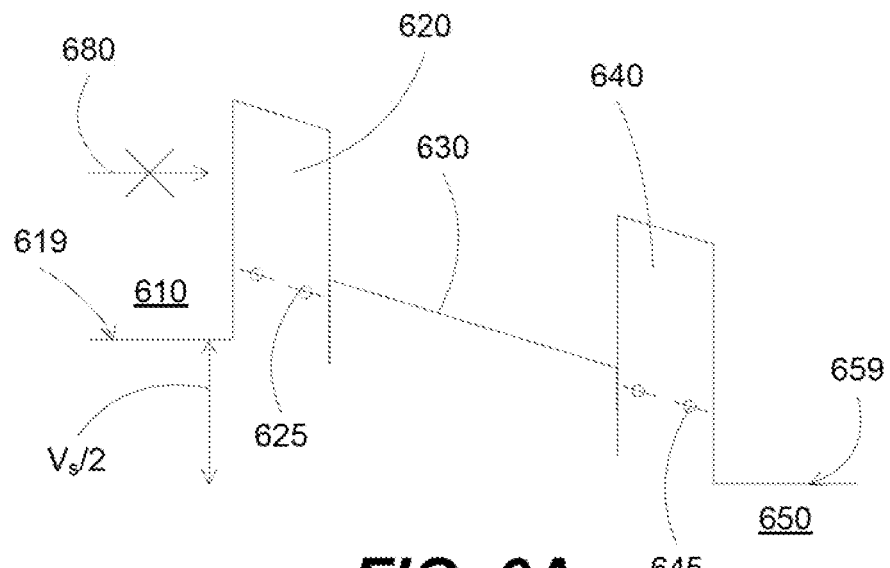
FIGS. 6A-6B illustrates a schematic of the operation of the current selector at low voltages according to some embodiments.
Figure 6B:
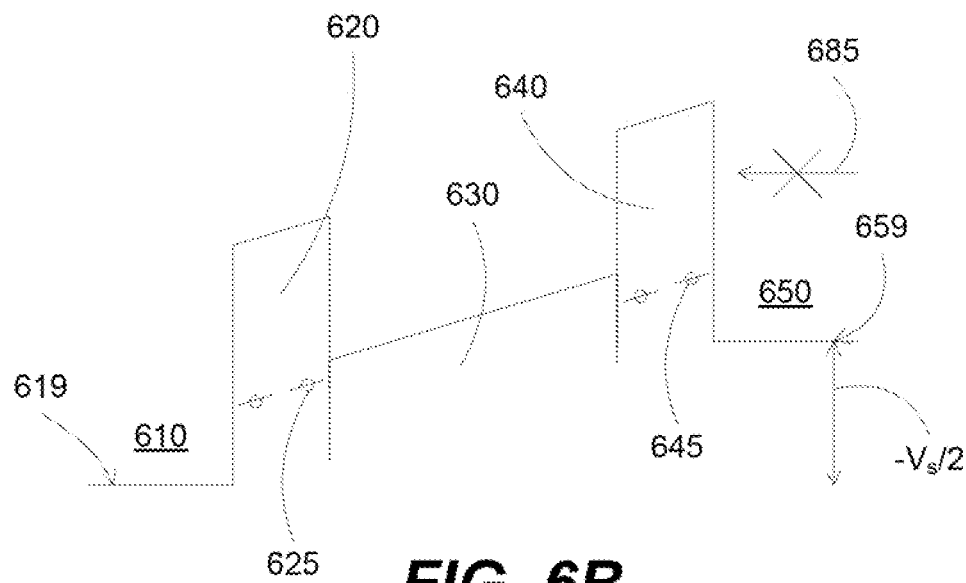

FIGS. 6A-6B illustrates a schematic of the operation of the current selector at low voltages according to some embodiments. The explanation serves as an illustration, and does not mean to bind the disclosure to any particular theory. A current selector can include a first high band gap layer 620, a low band gap layer 630, and a second high band gap layer 640. The current selector can be positioned between electrodes 610 and 650. The energy band shown includes the Fermi levels 619 and 659 for the electrodes, and the electron portion of the band diagram for the current selector. The high band gap layers 620 and 640 can include electron defects 625 and 645, e.g., defects that can allow electrons to pass through the high band gap layers 620 and 640.

In FIG. 6A, a positive voltage $V_s/2$ can be applied to the electrode 650, lowering the Fermi level 659 of the electrode 650. There is no current 680 (or only minimum leakage current) passing through the current selector in the low voltage region, since the electrons can be blocked by the Schottky barrier and the high band gap layer 620. In the low voltage region, the energy levels of the defects 625 are still higher than the Fermi level 619 of the electrode 610, thus there is no significant current flow.

In FIG. 6B, a positive voltage can be applied to the electrode 610, lowering the Fermi level 619 of the electrode 610. Alternatively, a negative voltage $-V_s/2$ can be applied to the electrode 650, raising the Fermi level 659 of the electrode 650. There are no currents 685 passing through the current selector, since the electrons can be blocked by the Schottky barrier and the high band gap layer 640. In the low voltage region, the energy levels of the defects 645 are still higher than the Fermi level 659 of the electrode 650, thus there is no significant current flow. Similar behaviors can be seen for hole conduction. The explanation is illustrative. Specific operations of the current selector can depend on the materials, the properties, and the process conditions of the device.

Figure 7A:
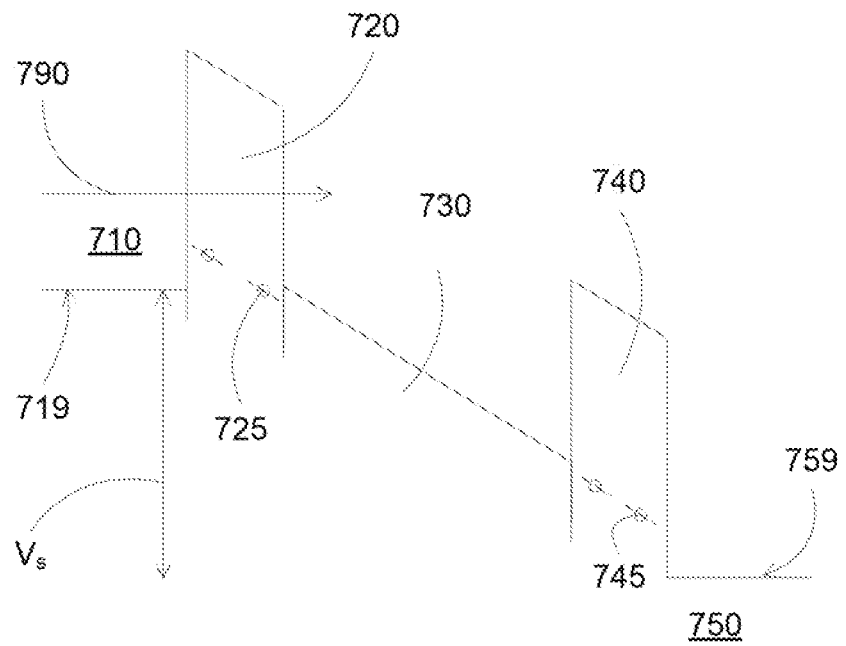
FIGS. 7A-7B illustrates a schematic of the operation of the current selector at high voltages according to some embodiments.
Figure 7B:
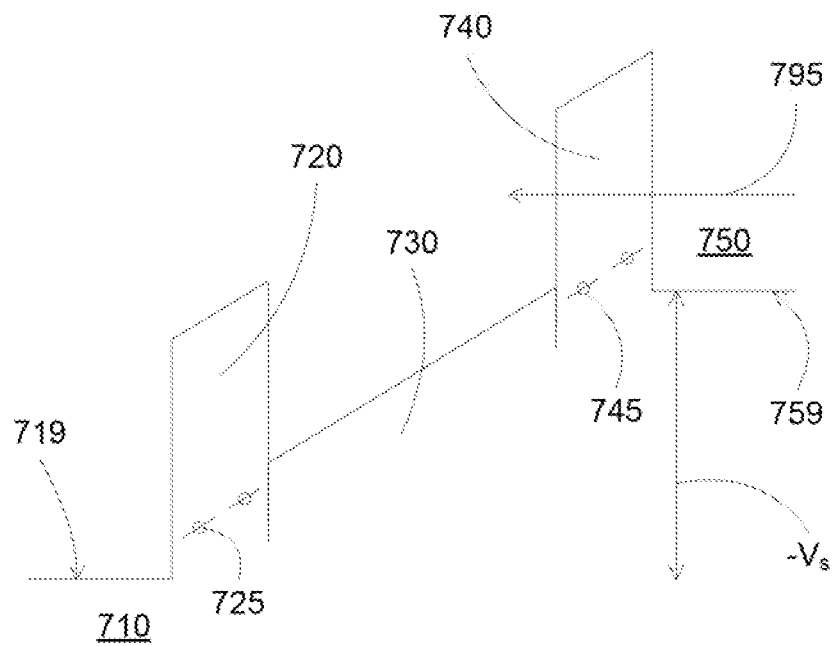

FIGS. 7A-7B illustrates a schematic of the operation of the current selector at high voltages according to some embodiments. A current selector can include a first high band gap layer 720, a low band gap layer 730, and a second high band gap layer 740. The current selector can be positioned between electrodes 710 and 750. The high band gap layers 720 and 740 can include electron defects 725 and 745, e.g., defects that can allow electrons to pass through the high band gap layers 720 and 740.

In FIG. 7A, a positive voltage $V_s$ can be applied to the electrode 750, lowering or raising the Fermi level 759 or 719 of the electrode 750 or 710, respectively. The high applied voltage can generate a defect tunneling current 790 passing through the high band gap 720. Since the applied voltage $V_s$ causes the energy levels of the defects 725 to be bent below the Fermi level 719 of the electrode 710, current 790 can tunnel through defects 725 through the high band gap layer 720. Further, since the low band gap layer 730 can have a conduction band minimum comparable with the defect energy levels, the current 790 can also pass through the low band gap 730 to the other electrode 750.

In FIG. 7B, a positive voltage can be applied to the electrode 710, lowering the Fermi level 719 of the electrode 710. Alternatively, a negative voltage $-V_s$ can be applied to the electrode 750, raising the Fermi level 759 of the electrode 750. The high applied voltage can generate a tunneling current 795 passing through the high band gap 740. Since the applied voltage $-V_s$ causes the energy levels of the defects 745 to be bent below the Fermi level 759 of the electrode 750, current 795 can tunnel through defects 745 through the high band gap layer 740. Further, since the low band gap layer 730 can have a conduction band minimum comparable with the defect energy levels, the current 795 can also pass through the low band gap 730 to the other electrode 710.

In some embodiments, an asymmetrical device can be provided. The asymmetrical selector device can have low leakage current at low voltages and high current at high voltages in one voltage polarity, and low leakage current at all voltages in an opposite voltage polarity. For example, at half an operating voltage in a positive polarity, the leakage current through the selector device can be small. At the operating voltage in the same positive polarity, the current through the selector device can be large. At negative bias, the current can be small.

Figure 8A:
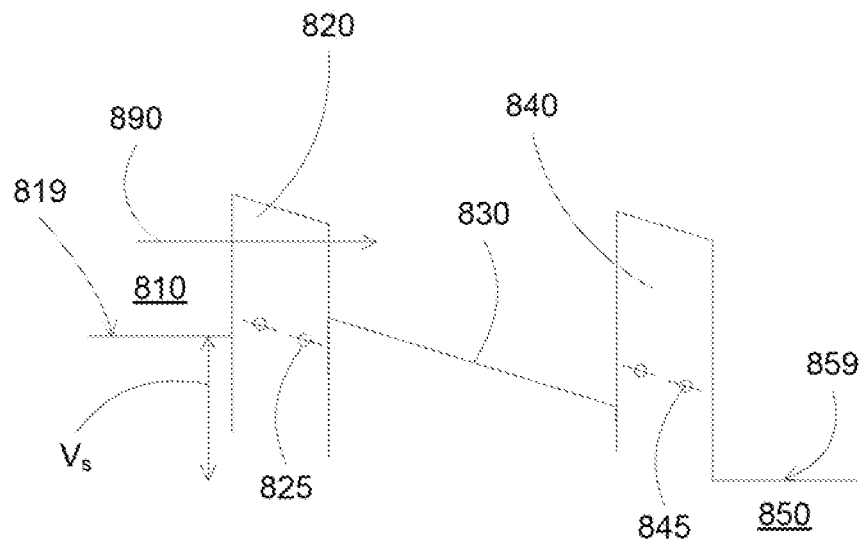
FIGS. 8A-8B illustrates a schematic of the operation of an asymmetrical current selector according to some embodiments.
Figure 8B:
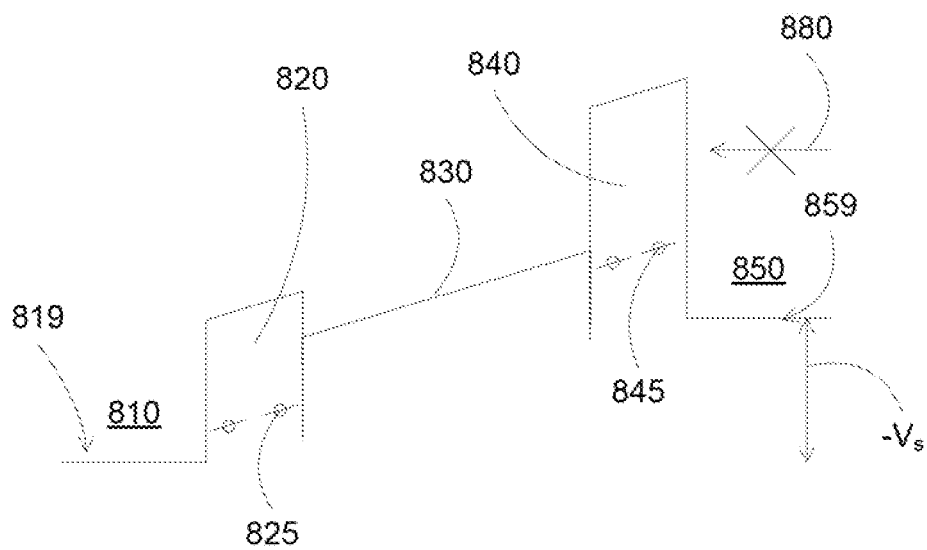

FIGS. 8A-8B illustrates a schematic of the operation of an asymmetrical current selector according to some embodiments. A current selector can include a first high band gap layer 820, a low band gap layer 830, and a second high band gap layer 840. The current selector can be positioned between electrodes 810 and 850. The energy band shown includes the Fermi levels 819 and 859 for the electrodes, and the electron portion of the band diagram for the current selector. The high band gap layers 820 and 840 can include electron defects 825 and 845, e.g., defects that can allow electrons to pass through the high band gap layers 820 and 840. The high band gap layers 820 and 840 can be chosen to present an asymmetrical energy band diagram, for example, by choosing dielectric 840 with larger band gap, or electrode 850 with lower Fermi level.

In FIG. 8A, a voltage $V_s$ can be applied to the electrode 850 or 810, lowering or raising the Fermi level 859 or 819 of the electrode 850 or 810, respectively. The high applied voltage can generate a defect tunneling current 890 passing through the high band gap layer 820, due to the high bending of the defect energy levels. Since the low band gap can have comparable energy level, e.g., the conduction band minimum of the low band gap layer 830 is within 0.2 to 0.3 eV of the defect energy levels, the current 890 can also pass through the low band gap layer 830.

In FIG. 8B, a voltage with opposite polarity can be applied to the electrode 850 or 810, raising or lowering the Fermi level 859 or 819 of the electrode 850 or 810, respectively. There are no currents 880 passing through the current selector, since the electrons can be blocked by the high energy barrier of the high band gap layer 840.

In some embodiments, the memory device including a memory element and a current selector can be used in a memory array, such as a cross point array. For example, the current selector can be fabricated on the memory element, forming a columnar memory device, which can be placed at the cross points of the word lines and bit lines.

Figure 9:
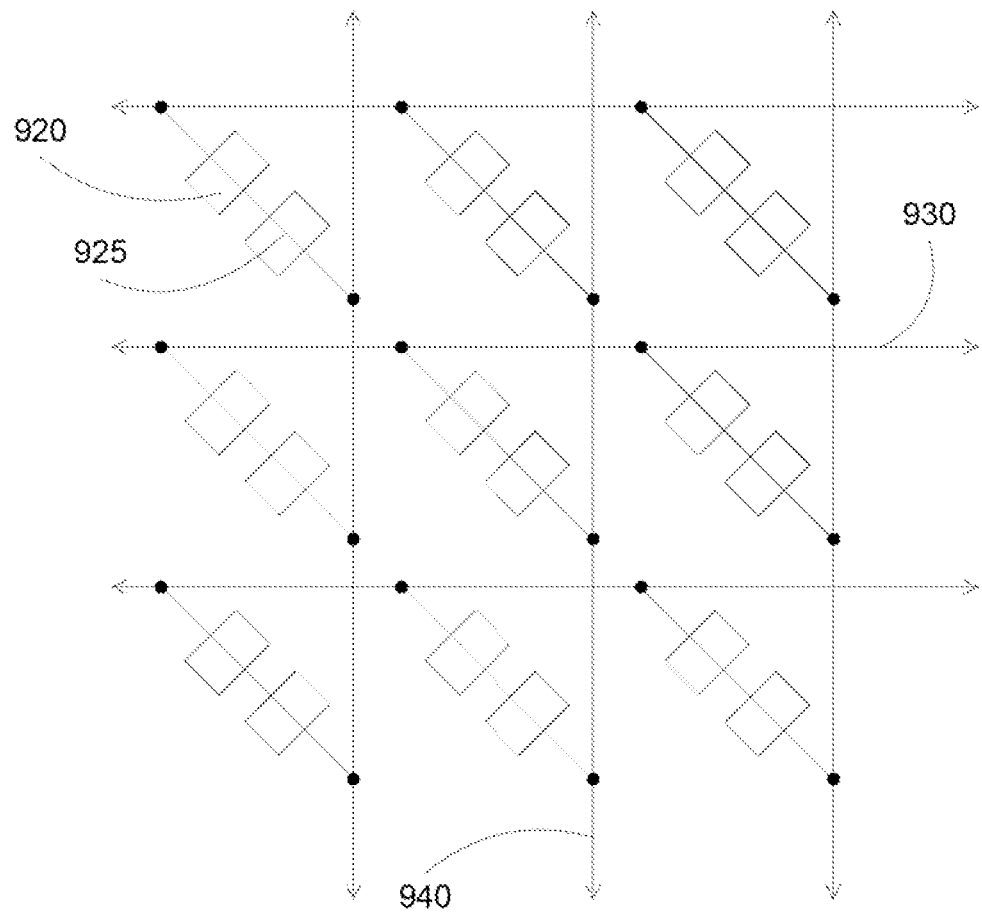
FIG. 9 illustrates a cross point memory array according to some embodiments.

FIG. 9 illustrates a cross point memory array according to some embodiments. A switching memory device can include a memory element 920 and a current selector 925, which are both disposed between the electrodes 930 and 940. The current selector 925 can be an intervening electrical component, disposed between electrode 930 and memory element 920, or between the electrode 940 and memory element 920. In some embodiments, the current selector 925 may include two or more layers of materials that are configured to provide a non linear response as discussed above.

In some embodiments, methods to form current selector can be provided. The methods can include depositing a first high band gap layer, a low band gap layer, and a second high band gap layer, together with performing treatments after each layer. The treatment can include rapid thermal annealing or plasma treatment, such as a rapid thermal anneal in temperatures between 200 and 400 C, plasma oxygen anneal, and/or in-situ annealing after deposition. The treatments can passivate or create defects in the high band gap layers to achieve the desired defect characteristics.

FIG. 10 illustrates a flowchart for forming a current selector according to some embodiments. The described flowchart is a general description of techniques used to form the current selectors described above. The flowchart describes techniques for forming a current selector generally including two electrodes and multiple layers disposed there between. Although certain processing techniques and specifications are described, it is understood that various other techniques and modifications of the techniques described herein may also be used.

In operation 1000, a first electrode layer is formed. The first electrode layer can include TiN, TaN, Pt, or Ru. Other elements can also be used, such as Ti, Al, $MoO_2$, W, poly-Si, TiSiN, TaSiN, or any combination, mixture or alloy thereof that can be formed using PVD or other processes. The first electrode can have any thickness, for example between about 5 nm and about 500 nm thick.

In operation 1010, a first dielectric or semiconductor layer can be formed on the first electrode. The first dielectric or semiconductor layer can be operable as a high band gap layer. The first high band gap layer can have low leakage, e.g., less than $10^3$ $A/cm^2$ at 2 V. The first high band gap layer can have large band gap, e.g., in the range of 4-10 eV. The first high band gap layer can have low electron affinity, e.g., in the range of 1 to 3.5 eV. The first high band gap layer can include $ZrO_x$, $HfO_x$, or $AlO_x$. The thickness of the first high band gap layer can be between 5 nm and 20 nm, or can be configured, e.g., incorporating defects or traps, to allow tunneling current at high voltages (2-5 V), and minimizing tunneling at low voltages (less than 2 V).

In operation 1020, a treatment can be performed after depositing the first high band gap layer. The treatment can include a plasma treatment or a high temperature treatment. For example, the treatment can include a rapid thermal oxidation at 300 C in oxygen ambient. The treatment can be performed in-situ after the deposition of the first high band gap layer. The treatment can include an oxygen radical anneal, e.g., plasma anneal in an oxygen ambient. The treatment can be configured to generate traps or defects, resulting in a high band gap defected layer. The treatment can include doping with a doping material, such as oxygen, carbon, boron, or silicon.

In some embodiments, the treatment can be configured to generate defects having energy levels which are about 0.3-0.7 eV higher than the Fermi level of the first electrode. The defects can have energy levels in the vicinity of a minimum defect energy level, which is about 0.3-0.7 eV above the Fermi level of the first electrode. The defects can have energy levels distributed from the minimum defect energy level to the conduction band minimum of the first layer.

In some embodiments, the high band gap layer can be deposited by a PVD or ALD process. For example, an ALD process can include $O_3$ oxidant, at about 250-300 C deposition temperature, using tetrakis(ethylmethylamino)zirconium (TEMAZ), Tris(dimethylamino)cyclopentadienyl Zirconium, tetrakis(ethylmethylamino)hafnium (TEMAHf), tetrakis(dimethylamido)hafnium (TDMAHf) precursors.

In operation 1030, a second dielectric or semiconductor layer can be formed on the first high band gap layer. The second dielectric or semiconductor layer can be operable as a low band gap layer. The second low band gap layer can have high leakage, e.g., in a range of $10^6$ to $10^7$ $A/cm^2$ at 2 V. The second low band gap layer can have low band gap, e.g., in the range of 1-3.5 eV. The second low band gap layer can high electron affinity, e.g., in the range of 3.5 to 6 eV. The second low band gap layer can include $TiO_x$, $TaO_x$, STO, or ZnO. Other materials can be used, such as $TiO_2$ or $TaO_2$. The thickness of the second dielectric layer can be between 5 nm and 20 nm. In some embodiments, the low band gap layer can have higher leakage current, smaller band gap, and/or higher electron affinity than the high band gap layer.

An optional treatment can be performed after depositing the second dielectric layer. The treatment can include a plasma treatment or a high temperature treatment. For example, the treatment can include a rapid thermal process at 300 C in a reduced ambient.

In some embodiments, the low band gap layer can be deposited by a PVD or ALD process. For example, an ALD process can include $H_2O$ oxidant, and at less than about 200 C deposition temperature.

In operation 1040, a third dielectric or semiconductor layer can be formed on the second layer. The third dielectric or semiconductor layer can be operable as a high band gap layer. The third high band gap layer can include $ZrO_x$, $HfO_x$, $AlO_x$, doped $ZrO_x$, doped $HfO_x$, or $AlO_x$. The thickness of the third dielectric layer can be between 5 nm and 20 nm.

In operation 1050, a treatment can be performed after depositing the third high band gap layer. The treatment can include a plasma treatment or a high temperature treatment. For example, the treatment can include a rapid thermal oxidation at 300 C in oxygen ambient. The treatment can include an oxygen radical anneal, e.g., plasma anneal in an oxygen ambient. The treatment can be configured to generate traps or defects, resulting in a high band gap defected layer. The treatment can include doping with a doping material, such as oxygen, carbon, boron, or silicon.

In some embodiments, the treatment can be configured to generate defects having energy levels which are about 0.3-0.7 eV higher than the Fermi level of a second electrode, which is to be deposited after the third layer. The defects can have energy levels in the vicinity of a minimum defect energy level, which is about 0.3-0.7 eV above the Fermi level of the second electrode. The defects can have energy levels distributed from the minimum defect energy level to the conduction band minimum of the third layer.

In operation 1060, a second electrode layer is formed on the current selector stack. The second electrode layer can include TiN, TaN, Ni, Pt, or Ru. Other elements can also be used, such as Ti, Al, $MoO_2$, W, poly-Si, TiSiN, TaSiN, or any combination, mixture or alloy thereof that can be formed using PVD or other processes. The second electrode can have any thickness, for example between about 5 nm and about 500 nm thick.

In some embodiments, the first and third layers, and the first and second electrodes, can be the same or can be different. Same materials and processes can produce symmetrical current selectors. Different materials and/or processes can produce asymmetrical current selectors.

In some embodiments, the high band gap layers can be different. For example, the first band gap layer can have a medium band gap, e.g., larger than the low band gap of the second layer and smaller than the large band gap of the third layer.

In some embodiments, the third band gap layer can have a medium band gap, e.g., larger than the low band gap of the second layer and smaller than the large band gap of the first layer.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A selector device for a memory device, the selector device comprising
   a first layer, wherein the first layer is operable as a first electrode,
wherein the first layer comprises a first Fermi level;
a second layer disposed above the first layer,
wherein the second layer comprises a dielectric or semiconductor layer,
wherein the second layer comprises a material having a first band gap, wherein the first band gap has a first conduction band minimum,
wherein the second layer is doped with a first doping material to form traps at energy levels between the first conduction band minimum and a first energy trap level,
wherein the first energy trap level is between 0.3 and 0.7 eV higher than the first Fermi level;
a third layer disposed above the second layer,
wherein the third layer comprises a dielectric layer,
wherein the third layer comprises a material different from that of the second layer,
wherein the third layer comprises a material having a second band gap, wherein the second band gap is smaller than the first band gap;
a fourth layer disposed above the third layer,
wherein the fourth layer comprises a dielectric layer,
wherein the fourth layer comprises a material having a third band gap, wherein the third band gap has a third conduction band minimum,
wherein the fourth layer is doped with a second doping material to form traps at energy levels between the third conduction band minimum and a second energy trap level;
a fifth layer disposed above the fourth layer,
wherein the fifth layer is operable as a second electrode.

2. A selector device as in claim 1 wherein the second energy trap level is between 0.3 and 0.7 eV higher than a Fermi level of the second electrode.

3. A selector device as in claim 1 wherein a conduction band minimum of the second band gap and the first energy trap level is different by an amount of less than 0.3 eV.

4. A selector device as in claim 1 wherein the doping material of the second layer is different from or the same as the material of the fourth layer.

5. A selector device as in claim 1 wherein the material of the second layer is different from or the same as the material of the fourth layer.

6. A selector device as in claim 1 wherein the first layer or the fifth layer comprises TiN, TaN, Pt, or Ru.

7. A selector device as in claim 1
wherein the second or fourth layer comprises a material having electron affinity between 1 and 2 eV,
wherein the second or fourth layer comprises a material having band gap energy between 4 and 10 eV, or
wherein a thickness of the second or fourth layer is between 5 and 20 nm.

8. A selector device as in claim 1 wherein the second or fourth layer comprises $ZrO_x$, $HfO_x$, or $AlO_x$.

9. A selector device as in claim 1 wherein the first or second doping material comprises N, C, B, Si, Ta, or Zr.

10. A selector device as in claim 1
wherein the third layer comprises a material having electron affinity between 3.5 and 4.5 eV,
wherein the third layer comprises a material having band gap energy between 1 and 3.5 eV, or
wherein a thickness of the third layer is between 5 and 20 nm.

11. A selector device as in claim 1 wherein the third layer comprises $TiO_x$, or $TaO_x$.

12. A memory array comprising
a first plurality of conductive lines;
a second plurality of conductive lines, wherein the second plurality of conductive lines is formed at an angle with the first plurality of conductive lines;
a plurality of elements disposed at the cross points of the first and second plurality of conductive lines, wherein each element comprises:
a first layer,
wherein the first layer is operable as a first electrode,
wherein the first layer comprises a first Fermi level;
a second layer disposed above the first layer,
wherein the second layer comprises a dielectric layer,
wherein the second layer comprises a material having a first band gap, wherein the first band gap has a first conduction band minimum,
wherein the second layer is doped with a doping material to form traps at energy levels between the first conduction band minimum and a first energy trap level,
wherein the first energy trap level is between 0.3 and 0.7 eV higher than the first Fermi level;
a third layer disposed above the second layer,
wherein the third layer comprises a dielectric layer,
wherein the third layer comprises a material different from that of the second layer,
wherein the third layer comprises a material having a second band gap, wherein the second band gap is smaller than the first band gap;
a fourth layer disposed above the third layer,
wherein the fourth layer comprises a dielectric layer,
wherein the fourth layer comprises a material having a third band gap, wherein the third band gap has a third conduction band minimum,
wherein the fourth layer is doped with a doping material to form traps at energy levels between the third conduction band minimum and a second energy trap level;
a fifth layer disposed above the fourth layer, wherein the fifth layer is operable as a second electrode;
a resistive switching memory element disposed above the fifth layer;
a sixth layer disposed above the first layer, wherein the sixth layer is operable as a third electrode.

13. A memory array as in claim 12 wherein the first layer or the fifth layer comprises TiN, TaN, Pt, or Ru.

14. A memory array as in claim 12 wherein the second or fourth layer comprises $ZrO_x$, $HfO_x$, or $AlO_x$, wherein the third layer comprises $TiO_x$, or $TaO_x$.

15. A selector device as in claim 12 wherein the first or second doping material comprises N, C, B, Si, Ta, or Zr.

* * * * *